United States Patent [19]
Hagiuda et al.

[11] Patent Number: 5,371,359
[45] Date of Patent: Dec. 6, 1994

[54] WATER-PROOF OPTICAL SWITCHING DEVICE FOR CONTROLLING FLASH LIGHT EMISSION

[75] Inventors: Nobuyoshi Hagiuda; Hideki Matsui, both of Yokohama; Hiroshi Sakamoto, Kawasaki; Norikazo Yokonuma, Tokyo, all of Japan

[73] Assignee: Nikon Corporation, Tokyo, Japan

[21] Appl. No.: 209,366

[22] Filed: Mar. 14, 1994

Related U.S. Application Data

[63] Continuation of Ser. No. 63,060, May 19, 1993, abandoned, which is a continuation of Ser. No. 916,633, Jul. 22, 1992, abandoned.

[30] Foreign Application Priority Data

Jul. 29, 1991 [JP] Japan .................. 3-066562[U]

[51] Int. Cl.$^5$ .................................. G01D 5/34
[52] U.S. Cl. ........................... 250/229; 200/61.02
[58] Field of Search ............... 250/229, 230, 231.1; 341/13; 200/61.02

[56] References Cited

U.S. PATENT DOCUMENTS

| | | | |
|---|---|---|---|
| 4,340,813 | 7/1982 | Sauer | 250/229 |
| 4,902,903 | 2/1990 | Segerson et al. | 250/229 |
| 5,061,848 | 10/1991 | Choi | 250/229 |

Primary Examiner—David C. Nelms
Assistant Examiner—K. Shami
Attorney, Agent, or Firm—Shapiro and Shapiro

[57] ABSTRACT

An optical switching device comprises a light emitting device, a reflector for reflecting a light emitted by the light emitting device and having a plurality of set states, a reflected light distribution being changed by switching the set state, a pair of photo-sensing devices for sensing a light from the reflector, and a detector for detecting a difference between light amounts sensed by the photo-sensing devices. The set state of the reflector is discriminated based on the detection output of the detector.

4 Claims, 6 Drawing Sheets

PD1 L1 PD2

PD1 L1 PD2

PD1  L1  PD2

WATER-PROOF OPTICAL SWITCHING DEVICE FOR CONTROLLING FLASH LIGHT EMISSION

This is a continuation of application Ser. No. 063,060 filed May 19, 1993, which is a continuation of application Ser. No. 916,633 filed Jul. 22, 1992, both now abandoned.

BACKGROUND OF THE INVENTION

1. Field of the Invention

The present invention relates to an optical switching device for externally switching in an apparatus housed in a water-proof case.

2. Related Background Art

In a prior art apparatus to be used in water, a switch for a power supply of the apparatus or for switching functions is constructed in a water-proof structure by forming a hole in a water-proof case, passing a switch shaft therethrough and arranging a water-proof O-ring at an engagement of the switch shaft and the hole, and rotating the switch shaft, or by arranging a reed switch or a leaf spring in the water-proof case and externally actuating the switch by a magnet.

However, the method of forming the hole in the water-proof case and rotating the switch shaft needs many parts for the water-proof around the shaft, is expensive, and is apt to cause the break of water tight and the leakage of water because the switch shaft water-tighted by the 0-ring moves in the hole formed in the case. In the method of externally actuating the reed switch or the leaf spring in the water-proof case by the magnet, the leakage of water can be avoided because of no through-hole but iron sand which is magnetic material deposits on the magnet, which leads to inoperation of the switch.

SUMMARY OF THE INVENTION

In the light of the above, it is an object of the present invention to provide an optical switching device which is free from leakage of water, stable in operation and inexpensive.

The optical switching device of the present invention comprises:

light emission means;
reflection means for reflecting a light emitted from said light emission means;
said reflection means having a plurality of set states and being capable of changing a reflected light distribution by switching the set states;
a pair of photo-sensing means for sensing a reflected light from said reflection means; and
detection means for detecting a difference between light amounts sensed by said photo-sensing means;
the set status of said reflection means being discriminated based on the detection output of said detection means.

DETAILED DESCRIPTION OF THE PREFERRED EMBODIMENTS

One embodiment of the present invention is now explained with reference to the drawings.

Figure 1:
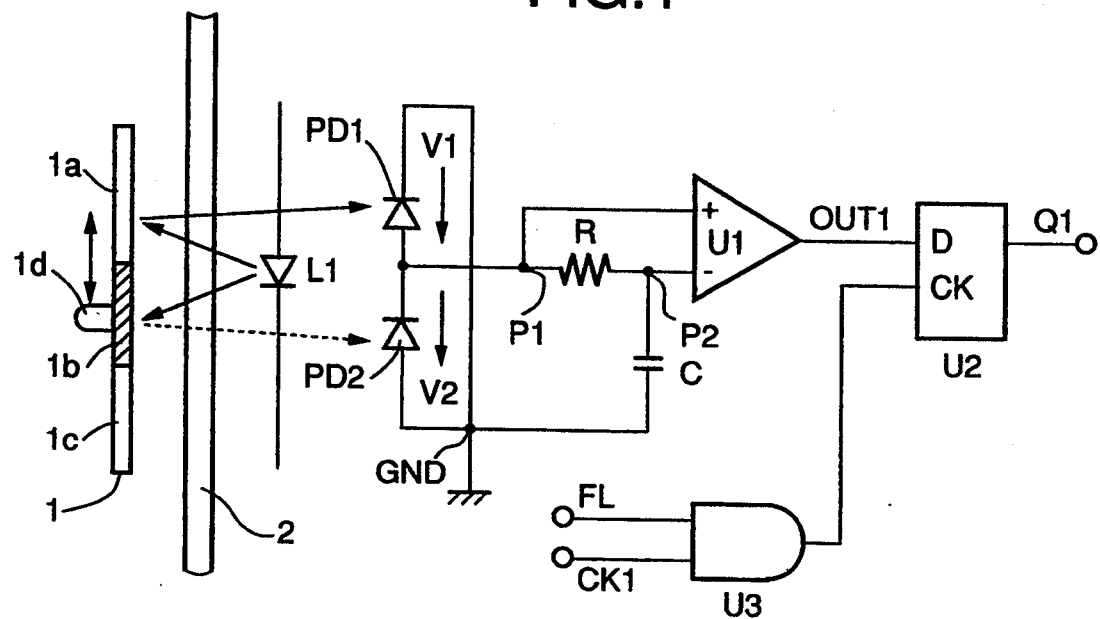
FIG. 1 shows a circuit diagram of one embodiment of an optical switching device of the present invention.
Figure 2:
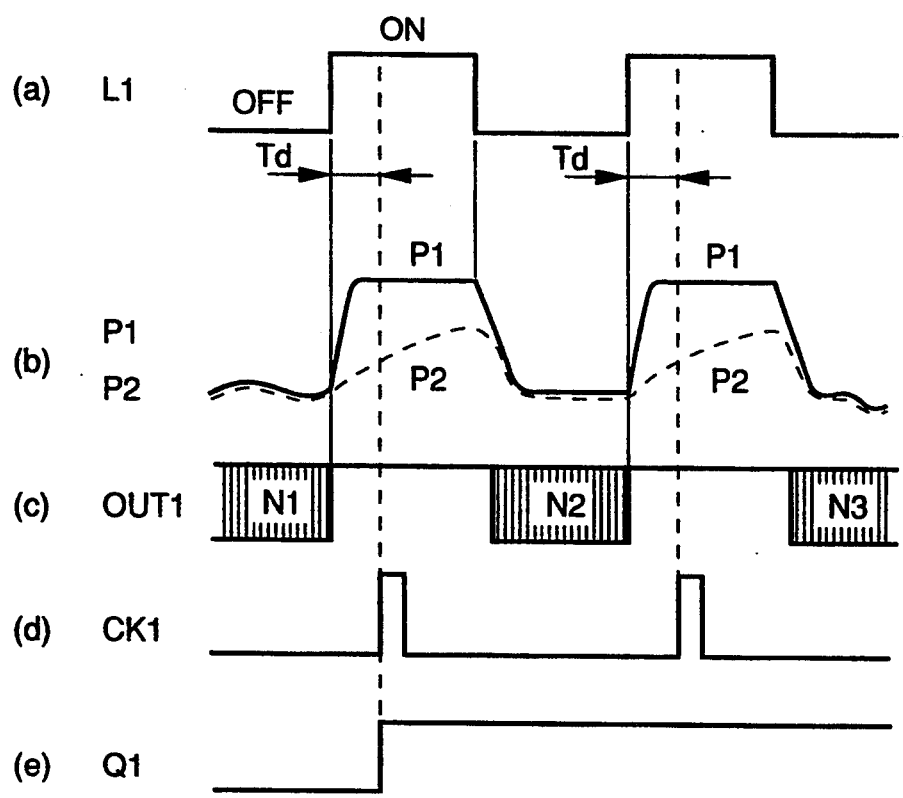
FIG. 2 shows a timing chart for explaining an operation of FIG. 1.

FIG. 1 shows a circuit diagram of a configuration of the optical switching device of the present invention. In the present embodiment, the present invention is applied to a hydrostroboscope (flash light) for use in submarine photographing. FIG. 2 shows a timing chart for explaining an operation of FIG. 1.

In FIG. 1, numeral 2 denotes a portion of a water-proof case which is made of a material which transmits therethrough a light emitted from illumination means L1 such as a light emitting diode, which illuminates a reflection plate 1 which is a portion of a console panel. The leftside of the water-proof case 2 is in water which is external of the water-proof case 2, and a circuit on the rightside is housed in and protected by the water-proof case 2.

The reflection plate 1 comprises a slidable actuation means 1d for the switch, reflection planes 1a and 1c of high reflectivity and a reflection plane 1b of low reflectivity. The switch is actuated by vertically sliding the sliding actuation means 1d along an arrow. The light emitted from the illumination means L1 is reflected by the reflection plane 1a and the reflection plane 1b so that a photo-sensing device PD1 is illuminated by a lighter light and a photo-sensing device PD2 is illuminated by a darker light. The photo-sensing devices PD1 and PD2 are constructed not to receive the light from the illumination means L1 directly but to receive only the light reflected by the reflection plate 1.

The photo-sensing devices PD1 and PD2 are photodiodes. A cathode of the photo-sensing device PD1 is connected to an anode of the photo-sensing device PD2, and a cathode of the photo-sensing device PD2 is connected to an anode of the photo-sensing device PD1 to form a closed circuit. When the photo-sensing devices PD1 and PD2 sense lights, they generate voltages V1 and V2 in the directions of arrows, respectively. A junction of the cathode of the photo-sensing device PD1 and the anode of the photo-sensing device PD2 is connected to a reference potential GND, and a junction P1 of the cathode of the photo-sensing device PD2 and the anode of the photo-sensing device PD1 is connected to a non-inverting input of a comparator U1. A resistor R and a capacitor C are series-connected between the junction P1 and the reference potential GND. The capacitor C is on the side of the reference potential GND, and a junction P2 of the resistor R and the capacitor C is connected to an inverting input of the comparator U1. The resistor R and the capacitor C forms memory means.

The potential at the junction P1 varies with the voltages which the photo-sensing devices PD1 and PD2 generate when they senses the lights. The potential at the junction P2 slowly changes with a delay from the change of the potential at the junction P1 by a CR filter characteristic of the resistor R and the capacitor C. Accordingly, the potential at the junction P2 exhibits mean voltage of the change at the junction P1. An output OUT1 of the comparator U1 is at an H-level when P1>P2, and at an L-level when P1<P2.

The output OUT1 of the comparator U1 is supplied to an input D of the latch U2. The latch U2 latches the input D in synchronism with the rise of a clock input CK to produce an output Q1. The clock input CK of the latch U2 is connected to an output of an AND gate U3. A read clock CK1 is sent from a circuit not shown to one input CK1 of the AND gate U3 at a timing to read the setting of the optical switch. The other input FL of the AND gate U3 is normally at the H-level but a signal of the L-level is sent from a circuit not shown while the stroboscope emits light. When the input FL is at the L-level, the output of the AND gate U3 remains at the L-level and no clock is transmitted to the clock input CK1. Accordingly, the latch U2 is inhibited.

An operation of the optical switching device of the present invention is now explained with reference to FIGS. 1 and 2.

When the photo-sensing devices PD1 and PD2 which are photo-diodes receive lights, they generate open voltages V1 and V2, respectively. The open voltage V of the photo-diode is expressed by:

$$V = (kT/q)\ln\{(\alpha E/I_s)+1\}$$

where
- k: Boltzmann's constant
- T: absolute temperature
- q: electron charge
- $\alpha$: constant
- E: illumination
- $I_s$: saturation current of diode Thus, the lighter the lights which the photo-sensing diodes PD1 and PD2 sense are, the larger are the open voltages V1 and V2. The potential $V_{P1}$ at the junction P1 is given by $$V_{P1} = V1 - V2$$

If the photo-sensing device PD1 receives a stronger light than the photo-sensing device PD2, $V_{P1}$ is positive, and if the photo-sensing device PD2 receives a stronger light than the photo-sensing device PD1, $V_{P1}$ is negative.

The illumination means L1 which comprises the light emitting diode periodically repeats the turn-on and the turn-off. While it is turned off, the photo-sensing devices PD1 and PD2 are exposed to stray light and the potential at the junction P1 is determined by the illumination by the stray light. If more stray light is directed to the photo-sensing device PD2, V1<V2 even if the reflection plate of higher reflectivity faces of the photo-sensing device PD1 as shown in FIG. 1. Even if the illumination means L1 is turned on and more reflected light of the illumination means L1 is directed to the photo-sensing device PD1, the relation of V1<V2 remains if the total illumination including the stray light is higher in the photo-sensing device PD2. Since the optical switch is used in the hydrostroboscope of the present invention, it is encapsulated by a transparent case and an external light having a high intensity causes stray light which illuminates the photo-sensing devices PD1 and PD2.

In the present invention, a change between the potentials at the junction P1 when the illumination means L1 comprising the light emitting diode is turned on and when it is not turned on and only the stray light exists is measured to determine the set position of the switch. Since the photo-sensing device PD1 senses more reflected light of the illumination means L1, the potential at the junction P1 when the illumination means L1 is turned on is higher than that when it is not turned on.

The potential at the junction P1 when the illumination means L1 is turned off is held in the capacitor C which is the memory means. The potential at the junction P2 when the illumination means L1 is turned off is essentially equal to the potential at the junction P1, and the output OUT1 of the comparator U1 changes between the H-level and the L-level by a slight change at the junction P1 so that it is astable as shown by N1, N2 and N3 in FIG. 2(c).

When the illumination means L1 is turned on, the reflected light from the reflection plate 1 is directed to the photo-sensing devices PD1 and PD2 which generate the voltages V1 and V2, respectively. Since more reflected light is directed to the photo-sensing device PD1, the voltage rise of the voltage V1 is larger than that of the voltage V2. As a result, the potential at the junction P1 rises. The voltage of the capacitor C which holds the potential at the junction P1 when the illumination means L1 is turned off starts to rise slowly to follow the rise at the junction P1. The potential at the junction P1 before the turn-on of the illumination means L1 is applied to the inverting input terminal of the comparator U1 and the potential at the junction P1 when the illumination means L1 is turned on is applied to the non-inverting input terminal. As a result, the output OUT1 of the comparator U1 is at the H-level.

When the illumination means L1 has been turned on and the voltages across the photo-sensing devices PD1 and PD2 are stabilized and the output of the comparator U1 is stabilized (a time Td later than the time of turn-on of the illumination means L1), the write clock CK1 is applied to the clock input terminal of the latch U2. Thus, the latch U2 latches the output of the comparator U1 and the output Q1 assumes the H-level.

It is now assumed that the optical switch is slid upward. The reflection plane 1b of the low reflectivity faces the photo-sensing device PD1 and the reflection plane 1c of the high reflectivity faces the photo-sensing device PD2. As a result, more reflected light of the illumination means L1 is directed to the photo-sensing device PD2. As a result, the voltage V2 across the photo-sensing device PD2 is larger than the voltage V1 across the photo-sensing device PD1, and the potential at the junction P1 falls. The output OUT1 of the comparator U1 is at the L-level and the output Q1 of the latch U2 is at the L-level.

In the optical switching device of the present invention, the output Q1 is at the H-level when the photo-sensing device PD1 faces the reflection plane 1a of the high reflectivity. Conversely, the output Q1 is at the L-level when it faces the reflection plane 1b of the low reflectivity. In this manner, the setting of the switch which is set externally of the water-proof case is read based on the output of the latch U2.

One input to the AND gate U3 is normally at the H-level and the write clock CK1 is directly applied to the clock input of the latch U2. When the hydrostroboscope emits light, the input FL is at the L-level in order to prevent the light switch from erroneously reading because the stray light by the flash light of the stroboscope (stray light 12 in FIG. 3) is very strong. The input FL is at the L-level prior to the start of flashing of the stroboscope, and returns to the H-level after the flash light terminates and the photo-sensing diodes PD1 and PD2 return to the normal state.

Figure 3:
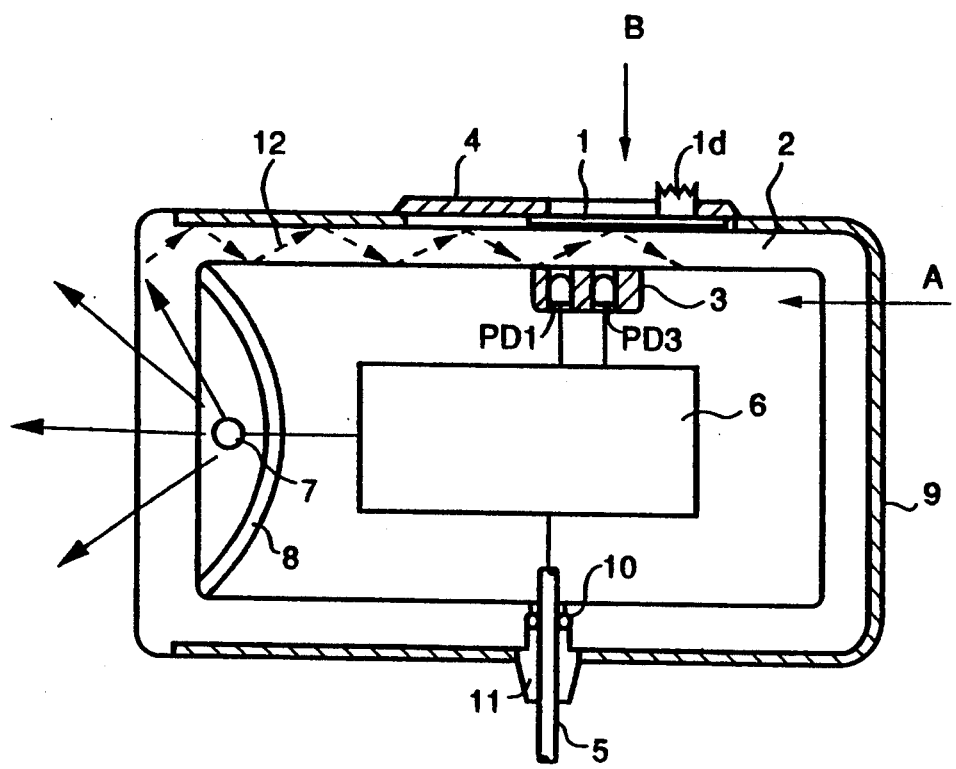
FIG. 3 shows a sectional view of a hydrostroboscope which uses the optical switching device of the present invention.

FIG. 3 shows a sectional view of a hydrostroboscope which uses the optical switching device of the present invention. The like elements are designated by the like numerals. In FIG. 3, the water-proof case 2 is covered with a cover 9 but the cover 9 is eliminated at a portion of the water-proof case 2 which faces a light emitting discharge tube and a reflection mirror 8 so that the illumination of the light emitting tube 7 when it is activated is directed to an object in front thereof. The light emission of the discharge tube 7 is controlled by a light emission control circuit 6. The light emission control circuit 6 which includes the optical switching circuit of the present invention is connected to a camera not shown by a cable 5. When a shutter of the camera is released, a light emission signal is transmitted through the cable 5 and the discharge tube 5 emits light. A portion of the light becomes a stray light which passes along a wall of the water-proof case 2 (stray light 12 in FIG. 3) or pass through a gap of the reflection mirror 8 and goes behind of it, and is directed to the photo-sensing devices PD1 and PD2. However, since the optical switching circuit does not read the switch position now, there is no erroneous reading.

An O-ring 10 and a cable retainer 11 are water-proof mechanism for the cable 5. A first optical switch which comprises the photo-sensing devices PD1 and PD2 and the illumination means L1, and a second optical switch which comprises photo-sensing devices PD3 and PD4 and illumination means L2 are built in a holder 3. Those switches are identical to that shown in FIG. 1. The two optical switches are connected to the optical switching circuit in the light emission control circuit 6, and the first optical switch has an output Q1 while the second optical switch has an output Q2. The reflection plate 1 and the sliding actuation means 1d are integral and are slidably housed between the cover 4 and the water-proof case 2. The cover 4, the cover 9 and the reflection plate 1 also function to prevent strong light such as sun light from directly impinging to the photo-sensing devices PD1–PD4 in order to prevent the malfunction which may occur when the strong light such as sun light impinges to only one of the pair of photo-sensing devices.

Figure 4:
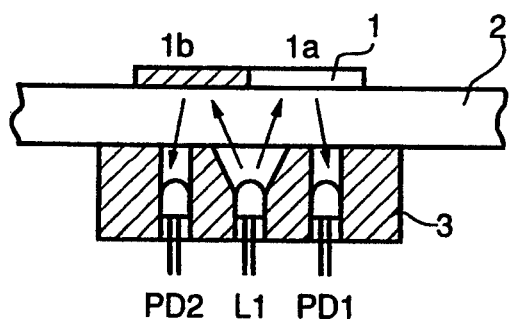
FIG. 4 shows a section view, taken along a line A in FIG. 3, of an optical switch unit.

FIG. 4 shows a sectional view of the optical switching unit of FIG. 3 as viewed along an arrow A, and FIGS. 5A–5D show those as viewed along an arrow B. In FIG. 4, the illumination means L1 and the photo-sensing devices PD1 and PD2 face the reflection plate 1 as shown in FIG. 1, and the illumination means L1 is arranged in the light non-transmitting holder 3 so that the light therefrom does not directly impinge to the photo-sensing devices PD1 and PD2. The illumination means L2 and the photo-sensing devices PD3 and PD4, which are not shown, are arranged in the same manner.

Figure 5A:
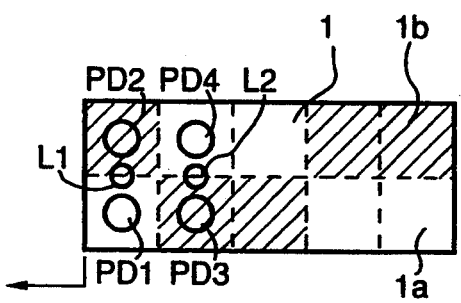
FIGS. 5A to 5D are plan views, as viewed from B in FIG. 3, of the optical switch unit.
Figure 5B:
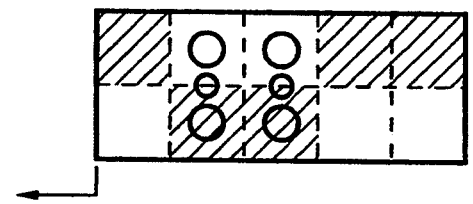
Figure 5C:
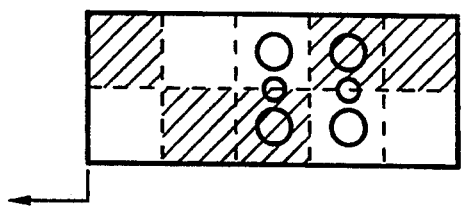
Figure 5D:
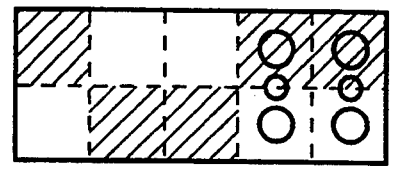

FIGS. 5A–5D show top views of the optical switching device to show the settings of the switch when it is slid. A hatched area of the reflection plate 1 is the reflection plane 1b of low reflectivity, and other area is the reflection plane 1a of high reflectivity. The outputs of the optical switching circuit are:

FIG. 5A: Q1=H-level; Q2=L-level
FIG. 5B: Q1=L-level; Q2=L-level
FIG. 5C: Q1=L-level; Q2=H-level
FIG. 5D: Q1=H-level; Q2=H-level.

Thus, four switching states can be discriminated by the two sets of optical switches.

Figure 6:
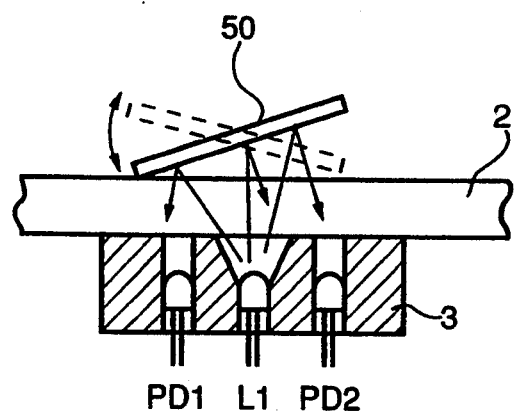
FIG. 6 shows a sectional view of other embodiment of a reflection plate of the optical switching device of the present invention.
Figure 7:
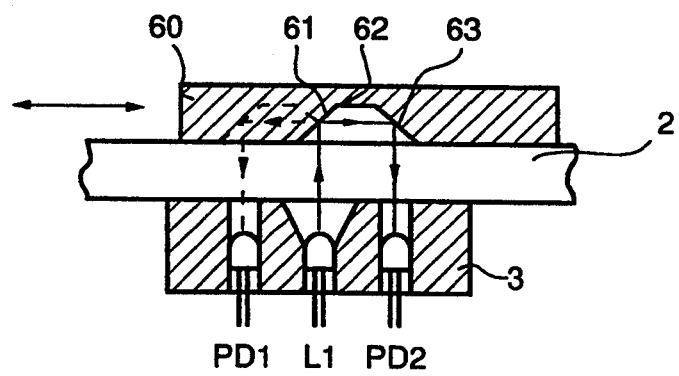
FIG. 7 shows a sectional view of a further embodiment of the reflection plate of the optical switching device of the present invention.
Figure 8:
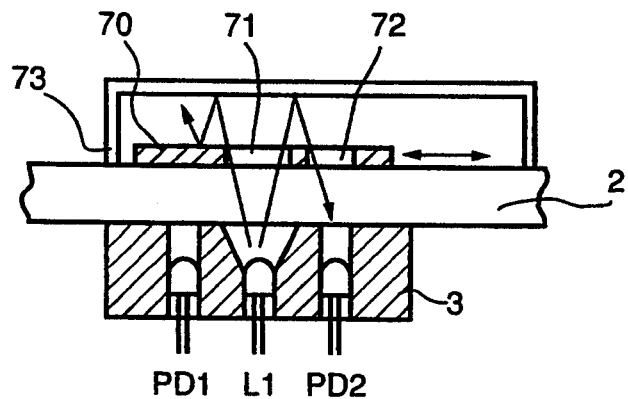
FIG. 8 shows a sectional view of other embodiment of the reflection plate of the optical switching device.

FIGS. 6–8 show other embodiments of the reflection plate of the optical switching device of the present invention. The optical switching circuit is identical to that of FIG. 1 and it is omitted. A reflection plate 50 in FIG. 6 has a uniform reflectivity and it is inclined. When it is inclined as shown by solid lines, the photo-sensing device PD2 senses more light and the output Q1 of the optical switch assumes the L-level. When it is inclined to the opposite direction as shown by broken lines, the output Q1 assumes the H-level. This mechanism may be used as a sea saw switch which switches by the change of inclination of the reflection plate 50.

In FIG. 7, a small chamber surrounded by walls 61, 62 and 63 of high reflectivity is provided in a reflection plate 60 to return the light of the illumination means L1 only to one of the photo-sensing devices PD1 and PD2. In a status shown by solid lines in FIG. 7, more light from the illumination means L1 is directed to the photo-sensing device PD2 and the optical switch output Q1 assumes the L-level. Conversely, in a status shown by broken lines, the output Q1 assumes the H-level. This switch may be used as a sliding switch.

In FIG. 8, the light of the illumination means L1 is condensed to a reflection chamber 73 of high reflectivity. A plate 70 having two apertures slides in the reflection chamber 73 along the plane of the water-proof case 2. The light of the illumination means L1 impinges to the reflection chamber 73 through one of the apertures of the plate 70 and diffuses in the reflection chamber 73. The other aperture of the plate 70 is positioned to face the photo-sensing device PD1 or PD2 by sliding the switch by sliding means not shown. In the setting of FIG. 8, since the aperture faces the photo-sensing device PD2, the output Q1 assumes the L-level. Since the reflection chamber 73 can completely cover the plate 70, the switch is suitable for a submarine switch in which sand and water are apt to penetrate.

Figure 9:
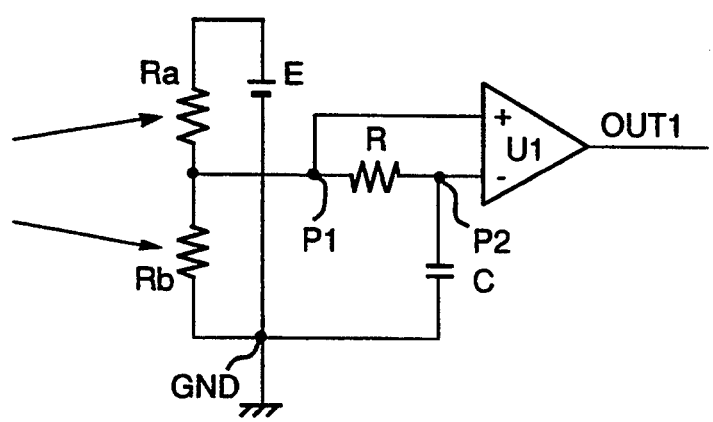
FIG. 9 shows a circuit diagram of other embodiment of the optical switching device of the present invention.

FIG. 9 shows an embodiment in which CdS devices Ra and Rb are used in place of the photo-sensing devices PD1 and PD2 of FIG. 1. Other elements than CdS devices Ra and Rb are identical to those of the first embodiment and the explanation thereof is omitted. When a light is directed to the CdS devices Ra and Rb, the resistances thereof change. When the photo-diode senses a light, an emf is generated, but the CdS device merely changes the resistance. Accordingly, a voltage E is applied to a series connection of the CdS devices Ra and Rb to take out an output from the junction P1 of the CdS devices Ra and Rb. When stronger light is directed to the CdS device Ra, the resistance of the CdS device Ra decreases more and the potential at the junction P1 rises. The optical switching circuit produces the same output as that when V1>V2 in FIG. 1.

While the optical switching device is applied to the hydrostroboscope in the above embodiments, it may be applied to a submarine camera having a built-in stroboscope.

In the optical switching device of the present invention, the affect by the stray light is eliminated and the exact readout is attained, and water leakage free and stable operation is attained with a low cost. The reflection type optical switching device of the present invention is very useful in the hydrodevice, particularly the hydrostroboscope to be used under sun light because the present optical switching device does not malfunction by the sun light. The water-proof case of the hydrodevice is, in most cases, transparent to facilitate the detection of leakage of water. As for the hydrostroboscope, the transparent water-proof case is advantageous because of the required function of emitting light to illuminate the object. Transparent plastic material is usually used for the transparent case but the thickness of the case to withstand the water pressure normally amounts to 10 mm. Thus, the malfunction by the affect of stray light is inevitable if the prior art reflection type photo-coupler switch is used. The optical switching device of the present invention further solves the leakage of water which has been inherent to the prior art water-proof switching device which uses the apertured water-proof case, and the trouble of the switching device which uses the magnet which attracts iron sand, and it can provide a more reliable hydrostroboscope.

What is claimed is:

1. An optical switching device used to control emission of flash light, comprising:
    an illuminator which emits light;
    a reflector disposed at a predetermined position to reflect light from said illuminator;
    said reflector having a plurality of set states and being capable of changing a reflected light distribution by switching the set states;
    a pair of photo-sensors disposed at a predetermined position to sense reflected light from said reflector; and
    a detector electrically connected to said pair of photo-sensors to detect a difference between light amounts sensed by said photo-sensors, the detector not detecting said difference during emission of said flash light;
    the set state of said reflector being discriminated based on the detection output of said detector.

2. An optical switching device according to claim 1, further comprising a water-proof case having a transparent area in at least a portion thereof, said illuminator, said photo-sensors and said detector being housed in said water-proof case and said reflector being located externally of said water-proof case.

3. An optical switching device according to claim 1, wherein said illuminator emits light repetitively with a predetermined repetition period, and said detector detects the difference at a predetermined timing in the repetition period.

4. An optical switching device comprising: an illuminator;
    a reflector which reflects light from said illuminator, distribution of reflected light changing in response to a position of said reflector;
    a switch which is operated by an operator to switch said position of said reflector;
    a pair of photo-sensors which sense said reflected light from said reflector;
    a detection circuitry which detects difference between light amounts of said photo-sensors;
    a memory electrically connected to said detection circuitry to store a first output of said detection circuitry prior to the illumination by said illuminator; and
    a comparator electrically connected to said memory and said detection circuitry to compare the first output with a second output of said detection circuitry produced immediately after the illumination by said illuminator;
    the status of said switch being discriminated based on the output of said comparator.

* * * * *